US010196756B2

(12) United States Patent
Watanabe et al.

(10) Patent No.: US 10,196,756 B2
(45) Date of Patent: Feb. 5, 2019

(54) β-GA2O3 SINGLE-CRYSTAL SUBSTRATE

(71) Applicants: TAMURA CORPORATION, Tokyo (JP); KOHA CO., LTD., Tokyo (JP)

(72) Inventors: Shinya Watanabe, Tokyo (JP); Kimiyoshi Koshi, Tokyo (JP); Yu Yamaoka, Tokyo (JP); Kazuyuki Iizuka, Tokyo (JP); Masaru Takizawa, Tokyo (JP); Takekazu Masui, Tokyo (JP)

(73) Assignees: TAMURA CORPORATION, Tokyo (JP); KOHA CO., LTD., Tokyo (JP)

(*) Notice: Subject to any disclaimer, the term of this patent is extended or adjusted under 35 U.S.C. 154(b) by 0 days.

(21) Appl. No.: 15/322,848

(22) PCT Filed: Jun. 29, 2015

(86) PCT No.: PCT/JP2015/068662
§ 371 (c)(1),
(2) Date: Dec. 29, 2016

(87) PCT Pub. No.: WO2016/002708
PCT Pub. Date: Jan. 7, 2016

(65) Prior Publication Data
US 2017/0152610 A1 Jun. 1, 2017

(30) Foreign Application Priority Data
Jun. 30, 2014 (JP) .................................. 2014-135454

(51) Int. Cl.
*C30B 29/00* (2006.01)
*C30B 29/16* (2006.01)
*C01G 15/00* (2006.01)
*C30B 15/34* (2006.01)

(52) U.S. Cl.
CPC .............. *C30B 29/16* (2013.01); *C01G 15/00* (2013.01); *C30B 15/34* (2013.01); *C01P 2002/77* (2013.01)

(58) Field of Classification Search
CPC ......... C01G 15/00; C30B 15/34; C30B 29/16; H01L 33/16; C01P 2002/77
USPC .......................................... 423/624; 117/944
See application file for complete search history.

(56) References Cited

U.S. PATENT DOCUMENTS

| 9,349,915 B2 | 5/2016 | Koshi et al. | |
| 2014/0217405 A1* | 8/2014 | Sasaki | H01L 29/7813 257/43 |
| 2014/0217469 A1* | 8/2014 | Sasaki | H01L 29/812 257/192 |
| 2014/0217554 A1* | 8/2014 | Sasaki | C30B 29/16 257/616 |
| 2014/0352604 A1 | 12/2014 | Koshi et al. | |
| 2015/0249185 A1 | 9/2015 | Koshi et al. | |
| 2016/0115621 A1 | 4/2016 | Koshi et al. | |

FOREIGN PATENT DOCUMENTS

| CN | 104878449 A | | 9/2015 |
| EP | 2924150 A1 | | 9/2015 |
| JP | 2006-273684 A | | 10/2006 |
| JP | 2008-156141 | * | 7/2008 |
| JP | 2008-303119 | * | 12/2008 |
| JP | 2011-190127 A | | 9/2011 |
| JP | 2013-082587 A | | 5/2013 |
| JP | 2013-103864 A | | 5/2013 |
| JP | 2013-237591 A | | 11/2013 |
| JP | 2014-221707 A | | 11/2014 |
| WO | WO 2013/035464 A1 | | 3/2013 |
| WO | WO2013/035842 | * | 3/2013 |

(Continued)

OTHER PUBLICATIONS

International Search Report dated Aug. 25, 2015 issued in PCT/JP2015/068662.
Aida, Hideo, et al., "Growth of β-Ga2o3 Single Crystals by the Edge-Defined Film Fed Growth Method": Japanese Journal of Applied Physics; vol. 47, No. 11, 2008; pp. 8506-8509.
Sasaki, Kohei, et al.; "Ga2O3 Schottky Barrier Diodes Fabricated by Using Single-Crystalk β-Ga2O3 (010) Substrates"; IEEE Electron Device Letters; vol. 34, No. 4, Apr. 2013.
Wagner, Guenter, et al., "Homoepitaxial Growht of β-Ga2O3 Layers by Metal-Organic Vapor Phase Epitaxy"; Phys. Status Solidi A 211, No. 1, 27-33 (2014).
European Search Report dated Feb. 22, 2018 issued in corresponding European Patent Application No. 15815529.1.

(Continued)

*Primary Examiner* — Steven J Bos
(74) *Attorney, Agent, or Firm* — Scully Scott Murphy and Presser

(57) ABSTRACT

A β-Ga$_2$O$_3$-based single-crystal substrate includes a β-Ga$_2$O$_3$-based single crystal, and a principal surface being a plane parallel to a b-axis of the β-Ga$_2$O$_3$-based single crystal. A maximum value of Δω on an arbitrary straight line on the principal surface that passes through a center of the principal surface is not more than 0.7264. The Δω is a difference between a maximum value and a minimum value of values obtained by subtracting $\omega_a$ from $\omega_s$ at each of measurement positions, where $\omega_s$ represents an angle defined by an X-ray incident direction and the principal surface at a peak position of an X-ray rocking curve on the straight line and $\omega_a$ represents an angle on an approximated straight line obtained by using least-squares method to linearly approximate a curve representing a relationship between the $\omega_s$ and the measurement positions thereof.

8 Claims, 7 Drawing Sheets

(56) References Cited

FOREIGN PATENT DOCUMENTS

WO     WO2013/035845     *    3/2013

OTHER PUBLICATIONS

Chinese Office Action dated May 18, 2018 issued in corresponding Chinese Patent Appln. No. 201580032689.9,, Issue No. 2018051501697590, with English translation.

* cited by examiner

β-GA2O3 SINGLE-CRYSTAL SUBSTRATE

TECHNICAL FIELD

The invention relates to a β-$Ga_2O_3$-based single-crystal substrate.

BACKGROUND ART

Use of EFG (Edge-defined Film-fed Growth) technique to grow a flat-plate-shaped $Ga_2O_3$ single crystal is known as a conventional method (see, e.g., PTL 1).

In PTL 1, $SiO_2$ is used as a dopant material to introduce Si into a $Ga_2O_3$ single crystal. Since $SiO_2$ has a small melting point difference from the $Ga_2O_3$ and has a low vapor pressure at a growth temperature of the $Ga_2O_3$ single crystal (at a melting point of a raw material of the $Ga_2O_3$ single crystal), it is easy to control the amount of dopant in the $Ga_2O_3$ single crystal.

Meanwhile, use of FZ (Floating Zone) technique to grow a column-shaped β-$Ga_2O_3$-based single crystal is also known as a conventional method (see, e.g., PTL 2).

In PTL 2, Si, Sn, Zr, Hf or Ge, etc., used as a thermally meltable control additive are added to a β-$Ga_2O_3$-based single crystal. Addition of the thermally meltable control additive increases infrared absorption properties of the β-$Ga_2O_3$-based single crystal and causes the β-$Ga_2O_3$-based single crystal to efficiently absorb infrared light from a light source of a FZ apparatus. Thus, even in a β-$Ga_2O_3$-based single crystal having a large outer diameter, a temperature difference between the center portion and the outer portion is reduced and the center portion is not solidified easily.

CITATION LIST

Patent Literature

[PTL 1]
JP-A-2011-190127
[PTL 2]
JP-A-2006-273684

SUMMARY OF INVENTION

Technical Problem

It is an object of the invention to provide a high-quality β-$Ga_2O_3$-based single-crystal substrate that has little variation in crystal structure.

Solution to Problem

According to an embodiment of the invention, in order to attain the object, a β-$Ga_2O_3$-based single-crystal substrate defined by [1] to [10] below is provided.

[1] A β-$Ga_2O_3$-based single-crystal substrate, comprising:
a β-$Ga_2O_3$-based single crystal; and
a principal surface being a plane parallel to a b-axis of the β-$Ga_2O_3$-based single crystal,
wherein a maximum value of $\Delta\omega$ on an arbitrary straight line on the principal surface that passes through a center of the principal surface is not more than 0.7264, and
wherein the $\Delta\omega$ is a difference between a maximum value and a minimum value of values obtained by subtracting $\omega_a$ from $\omega_s$ at each of measurement positions, where $\omega_s$ represents an angle defined by an X-ray incident direction and the principal surface at a peak position of an X-ray rocking curve on the straight line and $\omega_a$ represents an angle on an approximated straight line obtained by using least-squares method to linearly approximate a curve representing a relationship between the $\omega_s$ and the measurement positions thereof.

[2] A β-$Ga_2O_3$-based single-crystal substrate, comprising:
a β-$Ga_2O_3$-based single crystal; and
a principal surface being a plane parallel to a b-axis of the β-$Ga_2O_3$-based single crystal,
wherein a maximum value of $\alpha$ on an arbitrary straight line on the principal surface that passes through a center of the principal surface is not more than 0.141, and
wherein the $\alpha$ is an average value of absolute values obtained by subtracting $\omega_a$ from $\omega_s$ at each of measurement positions, where $\omega_s$ represents an angle defined by an X-ray incident direction and the principal surface at a peak position of an X-ray rocking curve on the straight line and $\omega_a$ represents an angle on an approximated straight line obtained by using least-squares method to linearly approximate a curve representing a relationship between the $\omega_s$ and the measurement positions thereof.

[3] The β-$Ga_2O_3$-based single-crystal substrate according to [1], wherein $\Delta\omega$ on a straight line perpendicular to the b-axis of the β-$Ga_2O_3$-based single crystal is a maximum among the $\Delta\omega$ on the arbitrary straight line.

[4] The β-$Ga_2O_3$-based single-crystal substrate according to [2], wherein $\alpha$ on a straight line perpendicular to the b-axis of the β-$Ga_2O_3$-based single crystal is a maximum among the $\alpha$ on the arbitrary straight line.

[5] The β-$Ga_2O_3$-based single-crystal substrate according to any one of [1] to [4], comprising a dopant.

[6] The β-$Ga_2O_3$-based single-crystal substrate according to [5], wherein the dopant is a Group IV element.

[7] The β-$Ga_2O_3$-based single-crystal substrate according to [6], wherein the dopant is Sn or Si.

[8] The β-$Ga_2O_3$-based single-crystal substrate according to any one of [1] to [7], wherein the principal surface is a (−201) plane, a (101) plane or a (001) plane.

[9] The β-$Ga_2O_3$-based single-crystal substrate according to any one of [1] to [8], wherein the substrate is cut out from a flat-plate-shaped β-$Ga_2O_3$-based single crystal grown in the b-axis direction.

[10] The β-$Ga_2O_3$-based single-crystal substrate according to any one of [1] to [9], wherein the substrate comprises no twinning plane or a region that does not include a twinning plane that is not less than 2 inches in a maximum width in a direction perpendicular to an intersection line between the twinning plane and the principal surface.

Advantageous Effects of Invention

According to the invention, a high-quality β-$Ga_2O_3$-based single-crystal substrate that has little variation in crystal structure can be provided.

DESCRIPTION OF EMBODIMENT

Embodiment

Summary of Embodiment

In the present embodiments, a plate-shaped β-Ga$_2$O$_3$-based single crystal is grown from a seed crystal. It is possible to reduce variation in crystal structure by using the growth method described later to grow the plate-shaped β-Ga$_2$O$_3$-based single crystal.

Variation in crystal structure of β-Ga$_2$O$_3$-based single crystal has a peak along a direction perpendicular to the b-axis direction. Thus, in the present embodiment, variation in crystal structure of a β-Ga$_2$O$_3$-based single-crystal substrate cut out from a plate-shaped β-Ga$_2$O$_3$-based single crystal is used as an evaluation indicator and is measured in a direction parallel to the principal surface as well as perpendicular to the b-axis direction.

(Method of Manufacturing β-Ga$_2$O$_3$-Based Single-Crystal Substrate)

A method of manufacturing a β-Ga$_2$O$_3$-based single-crystal substrate 1 having little variation in crystal structure will be described below as an example.

Figure 1:
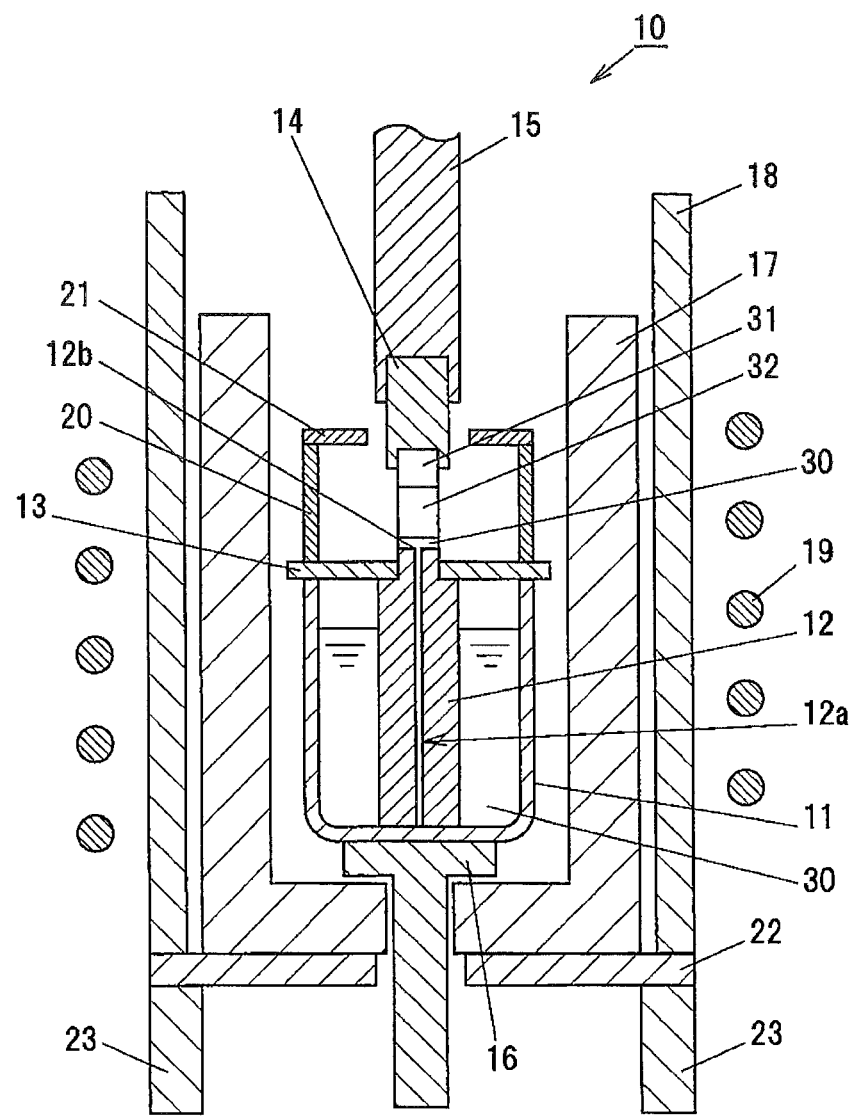
FIG. 1 is a vertical cross-sectional view showing an EFG crystal manufacturing apparatus in a first embodiment.

FIG. 1 is a vertical cross-sectional view showing an EFG (Edge Defined Film Fed Growth) crystal manufacturing apparatus 10 in the first embodiment.

The EFG crystal manufacturing apparatus 10 has a crucible 11 which is placed in a quartz tube 18 and contains Ga$_2$O$_3$-based melt 30, a die 12 placed in the crucible 11 and having a slit 12a, a lid 13 covering an opening of the crucible 11 so that the top surface of the die 12 including an opening 12b is exposed, a seed crystal holder 14 for holding a seed crystal 31, a shaft 15 vertically movably supporting the seed crystal holder 14, a support base 16 for placing the crucible 11, a heat insulator 17 provided along an inner wall of the quartz tube 18, a high-frequency coil 19 for high-frequency induction heating provided around the quartz tube 18, a base 22 for supporting the quartz tube 18 and the heat insulator 17, and leg portions 23 attached to the base 22.

The EFG crystal manufacturing apparatus 10 further includes an after-heater 20 and a reflective plate 21. The after-heater 20 is formed of Ir, etc., and is provided to surround a region above the crucible 11 where a β-Ga$_2$O$_3$-based single crystal 32 is grown. The reflective plate 21 is formed of Ir, etc., and is provided, like a lid, on the after-heater 20.

The crucible 11 contains the Ga$_2$O$_3$-based melt 30 which is obtained by melting a Ga$_2$O$_3$-based raw material. The crucible 11 is formed of a highly heat-resistant material such as Ir capable of containing the Ga$_2$O$_3$-based melt 30.

The die 12 has the slit 12a to draw up the Ga$_2$O$_3$-based melt 30 in the crucible 11 by capillary action. The die 12 is formed of a highly heat-resistant material such as Ir in the same manner as the crucible 11.

The lid 13 prevents the high-temperature Ga$_2$O$_3$-based melt 30 from evaporating from the crucible 11 and further prevents the evaporated substances from attaching to members located outside of the crucible 11.

The high-frequency coil 19 is helically arranged around the quartz tube 18 and inductively heats the crucible 11 and the after-heater 20 by a high-frequency current which is supplied from a non-illustrated power source. This causes the Ga$_2$O$_3$-based raw material in the crucible to melt and the Ga$_2$O$_3$-based melt 30 is thereby obtained.

The heat insulator 17 is provided around the crucible 11 with a predetermined gap. The heat insulator 17 retains heat and is thus capable of suppressing a rapid temperature change of the inductively-heated crucible 11, etc.

The after-heater 20 generates heat by induction heating and the reflective plate 21 downwardly reflects heat radiated from the after-heater 20 and the crucible 11. The present inventors confirmed that the after-heater 20 is capable of reducing radial (horizontal) temperature gradient in a hot zone and the reflective plate 21 is capable of reducing temperature gradient in a crystal growth direction in the hot zone.

It is possible to reduce dislocation density of the β-Ga$_2$O$_3$-based single crystal 32 by providing the after-heater 20 and the reflective plate 21 on the EFG crystal manufacturing apparatus 10. This allows the β-Ga$_2$O$_3$-based single-crystal substrate 1 having little variation in crystal structure to be obtained from the β-Ga$_2$O$_3$-based single crystal 32.

Figure 2:
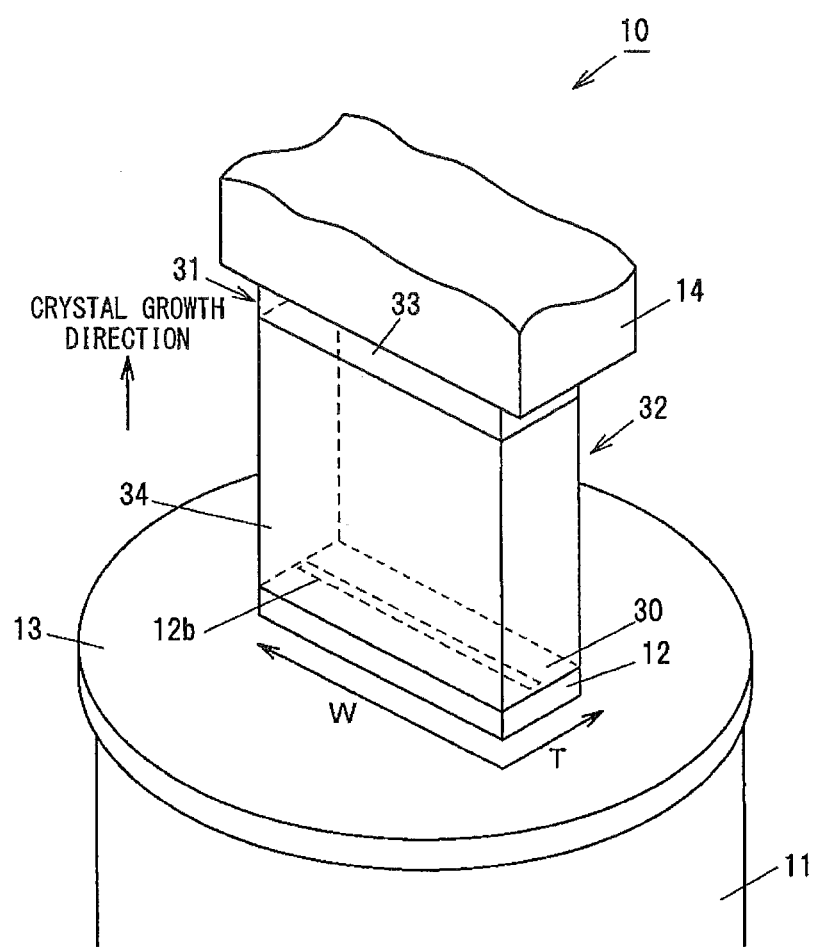
FIG. 2 is a perspective view showing a state during growth of a β-$Ga_2O_3$-based single crystal in the first embodiment.

FIG. 2 is a perspective view showing a state during growth of the β-Ga$_2$O$_3$-based single crystal 32 in the first embodiment. Illustrations of members around the β-Ga$_2$O$_3$-based single crystal 32 are omitted in FIG. 2.

To grow the β-Ga$_2$O$_3$-based single crystal 32, firstly, the Ga$_2$O$_3$-based melt 30 in the crucible 11 is drawn up to the opening 12b of the die 12 through the slit 12a of the die 12, and the seed crystal 31 is then brought into contact with the Ga$_2$O$_3$-based melt 30 present in the opening 12*b* of the die 12. Next, the seed crystal 31 in contact with the Ga$_2$O$_3$-based melt 30 is pulled vertically upward, thereby growing the β-Ga$_2$O$_3$-based single crystal 32. The crystal growth direction shown in FIG. 2 is a direction parallel to the b-axis of the β-Ga$_2$O$_3$-based single crystal 32 (the b-axis direction).

The β-Ga$_2$O$_3$-based single crystal 32 and the seed crystal 31 are β-Ga$_2$O$_3$ single crystals, or Ga$_2$O$_3$ single crystals doped with an element such as Al or In, and may be, e.g., a (Ga$_x$Al$_y$In$_{(1-x-y)}$)$_2$O$_3$ (0<x≤1, 0≤y≤1, 0<x+y≤1) single crystal which is a β-Ga$_2$O$_3$ single crystal doped with Al and In. The band gap is widened by adding Al and is narrowed by adding In. The β-Ga$_2$O$_3$-based single crystal 32 may also contain an element, e.g., Mg, Fe, Cu, Ag, Zn, Cd, Al, In, Si, Ge, Sn, Pb or Nb, etc., as a dopant.

The seed crystal 31 is a β-Ga$_2$O$_3$-based single crystal which does not have or hardly has twinning planes. The seed crystal 31 has substantially the same width and thickness as the β-Ga$_2$O$_3$-based single crystal 32 to be grown. Thus, it is possible to grow the β-Ga$_2$O$_3$-based single crystal 32 without broadening a shoulder thereof in a width direction W and a thickness direction T.

Since the growth of the β-Ga$_2$O$_3$-based single crystal 32 does not involve a process of broadening a shoulder in the width direction W, twinning of the β-Ga$_2$O$_3$-based single crystal 32 is suppressed. Meanwhile, unlike the broadening of shoulder in the width direction W, twins are less likely to be formed when broadening the shoulder in the thickness direction T, and thus the growth of the β-Ga$_2$O$_3$-based single crystal 32 may involve a process of broadening a shoulder in the thickness direction T. However, in the case that the process of broadening a shoulder in the thickness direction T is not performed, substantially the entire β-Ga$_2$O$_3$-based single crystal 32 becomes a plate-shaped region which can be cut into substrates and this allows the substrate manufacturing cost to be reduced. Therefore, it is preferable to not perform the process of broadening a shoulder in the thickness direction T but to use a thick seed crystal 31 to ensure sufficient thickness of the β-Ga$_2$O$_3$-based single crystal 32 as shown in FIG. 2.

The plane orientation of a horizontally-facing surface 33 of the seed crystal 31 coincides with that of a principal surface 34 of the β-Ga$_2$O$_3$-based single crystal 32. Therefore, for obtaining the β-Ga$_2$O$_3$-based single-crystal substrate 1 having, e.g., the (−201)-oriented principal surface from the β-Ga$_2$O$_3$-based single crystal 32, the β-Ga$_2$O$_3$-based single crystal 32 is grown in a state that the surface 33 of the seed crystal 31 is oriented to (−201).

The β-Ga$_2$O$_3$-based single crystal has high cleavability on the (100) plane, and twins with the (100) plane as a twinning plane (a plane of symmetry) are likely to be formed in the shoulder broadening process during crystal growth. The b-axis direction, which is the crystal growth direction of the β-Ga$_2$O$_3$-based single crystal 32 in the present embodiment, is parallel to the (100) plane. Therefore, even if twins are formed, it is still possible to cut out a relatively large β-Ga$_2$O$_3$-based single-crystal substrate of, e.g., not less than 2 inches which does not contain twins. It is also possible to cut out a β-Ga$_2$O$_3$-based single-crystal substrate having a region which has a maximum width of not less than 2 inches in a direction perpendicular to a line of intersection between a twinning plane and the principal surface and does not contain twinning planes.

Next, a method in which a wide seed crystal 31 with a width equivalent to the β-Ga$_2$O$_3$-based single crystal 32 is formed using a quadrangular prism-shaped narrow-width seed crystal will be described.

Figure 3:
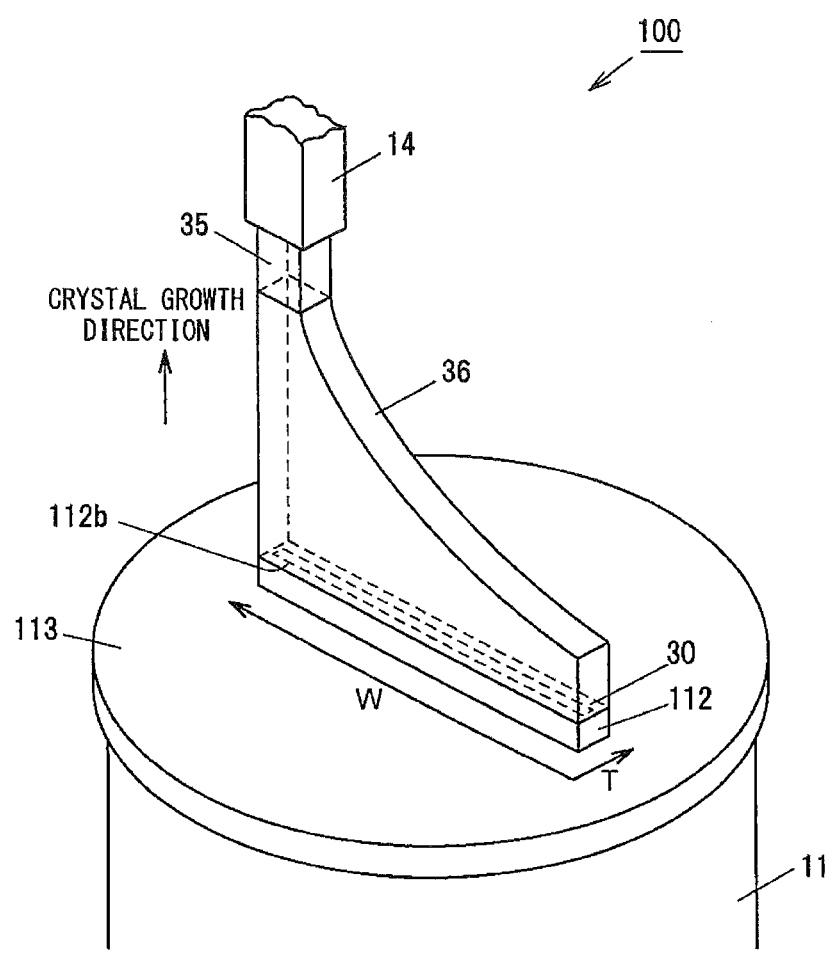
FIG. 3 is a perspective view showing a state of growing a β-$Ga_2O_3$-based single crystal to be cut into a seed crystal.

FIG. 3 is a perspective view showing a state of growing β-Ga$_2$O$_3$-based single crystal 36 to be cut into the seed crystal 31.

The seed crystal 31 is cut from a region of the β-Ga$_2$O$_3$-based single crystal 36 not having or hardly having twinning planes. Therefore, a width (a size in the width direction W) of the β-Ga$_2$O$_3$-based single crystal 36 is larger than the width of the seed crystal 31.

Meanwhile, a thickness (a size in the thickness direction T) of the β-Ga$_2$O$_3$-based single crystal 36 may be smaller than the thickness of the seed crystal 31. In such a case, the seed crystal 31 is not cut directly from the β-Ga$_2$O$_3$-based single crystal 36. Instead, a β-Ga$_2$O$_3$-based single crystal is firstly grown from a seed crystal cut from the β-Ga$_2$O$_3$-based single crystal 36 while broadening a shoulder in the thickness direction T and is then cut into the seed crystal 31.

For growing the β-Ga$_2$O$_3$-based single crystal 36, it is possible to use an EFG crystal manufacturing apparatus 100 which has substantially the same structure as the EFG crystal manufacturing apparatus 10 used for growing the β-Ga$_2$O$_3$-based single crystal 32. However, width, or width and thickness, of a die 112 of the EFG crystal manufacturing apparatus 100 is/are different from that/those of the die 12 of the EFG crystal manufacturing apparatus 10 since the width, or width and thickness, of the β-Ga$_2$O$_3$-based single crystal 36 is/are different from that/those of the β-Ga$_2$O$_3$-based single crystal 32. The size of an opening 112*b* of the die 112 is generally the same as the opening 12*b* of the die 12 but may not be the same.

A seed crystal 35 is a quadrangular prism-shaped β-Ga$_2$O$_3$-based single crystal with a smaller width than the β-Ga$_2$O$_3$-based single crystal 36 to be grown.

To grow the β-Ga$_2$O$_3$-based single crystal 36, firstly, the Ga$_2$O$_3$-based melt 30 in the crucible 11 is drawn up to the opening 112*b* of the die 112 through a slit of the die 112, and the seed crystal 35 is then brought into contact with the Ga$_2$O$_3$-based melt 30 present in the opening 112*b* of the die 112 in a state that a horizontal position of the seed crystal 35 is offset in the width direction W from the center of the die 12 in the width direction W. In this regard, more preferably, the seed crystal 35 is brought into contact with the Ga$_2$O$_3$-based melt 30 covering the top surface of the die 112 in a state that the horizontal position of the seed crystal 35 is located above an edge of the die 112 in the width direction W.

Next, the seed crystal 35 in contact with the Ga$_2$O$_3$-based melt 30 is pulled vertically upward, thereby growing the β-Ga$_2$O$_3$-based single crystal 36.

In case that the growing β-Ga$_2$O$_3$-based single crystal is twinned during the process of broadening a shoulder in a width direction, twinning planes are likely to be formed in a region close to the seed crystal and are less likely to be formed at positions distant from the seed crystal.

The method of growing the β-Ga$_2$O$_3$-based single crystal 36 in the present embodiment uses such twinning properties of the β-Ga$_2$O$_3$-based single crystal. In the present embodiment, since the β-Ga$_2$O$_3$-based single crystal 36 is grown in the state that the horizontal position of the seed crystal 35 is offset in the width direction W from the center of the die 12 in the width direction W, a region far from the seed crystal 35 is large in the β-Ga$_2$O$_3$-based single crystal 36, as compared to the case of growing the β-Ga$_2$O$_3$-based single crystal 36 in a state that the horizontal position of the seed crystal 35 is located on the center of the die 12 in the width direction W. Twinning planes are less likely to be formed in such a region and it is thus possible to cut out a wide seed crystal 31.

For growing the β-Ga$_2$O$_3$-based single crystal 36 using the seed crystal 35 and for cutting the β-Ga$_2$O$_3$-based single crystal 36 into a seed crystal, it is possible to use a technique disclosed in Japanese Patent Application No. 2013-102599.

Next, an example method of cutting the grown β-Ga$_2$O$_3$-based single crystal 32 into the β-Ga$_2$O$_3$-based single-crystal substrate 1 will be described.

Firstly, the β-Ga$_2$O$_3$-based single crystal 32 having a thickness of, e.g., 18 mm is grown and is then annealed to relieve thermal stress during single crystal growth and to improve electrical characteristics. The annealing is performed e.g., in an inactive atmosphere such as nitrogen while maintaining temperature at 1400 to 1600° C. for 6 to 10 hours.

Next, the seed crystal 31 and the β-Ga$_2$O$_3$-based single crystal 32 are separated by cutting with a diamond blade. Firstly, the β-Ga$_2$O$_3$-based single crystal 32 is fixed to a carbon stage with heat-melting wax in-between. The β-Ga$_2$O$_3$-based single crystal 32 fixed to the stage is set on a cutting machine and is cut for separation. The grit number of the blade is preferably about #200 to #600 (defined by JIS B 4131) and a cutting rate is preferably about 6 to 10 mm per minute. After cutting, the β-Ga$_2$O$_3$-based single crystal 32 is detached from the carbon stage by heating.

Next, the edge of the β-Ga$_2$O$_3$-based single crystal 32 is shaped into a circular shape by an ultrasonic machining device or a wire-electrical discharge machine. Orientation flats may be formed at the edge of the circularly-shaped β-Ga$_2$O$_3$-based single crystal 32.

Next, the circularly-shaped β-Ga$_2$O$_3$-based single crystal 32 is sliced to about 1 mm thick by a multi-wire saw, thereby obtaining the β-Ga$_2$O$_3$-based single-crystal substrate 1. In this process, it is possible to slice at a desired offset angle. It is preferable to use a fixed-abrasive wire saw. A slicing rate is preferably about 0.125 to 0.3 mm per minute.

Since the β-Ga$_2$O$_3$-based single crystal 32 is a single crystal grown in the b-axis direction, the principal surface of the β-Ga$_2$O$_3$-based single-crystal substrate 1 cut out from the β-Ga$_2$O$_3$-based single crystal 32 is a plane parallel to the b-axis, such as a (−201) plane, a (101) plane or a (001) plane.

Next, the β-Ga$_2$O$_3$-based single-crystal substrate 1 is annealed to reduce processing strain and to improve electrical characteristics as well as permeability. The annealing is performed in an oxygen atmosphere during temperature rise and is performed in an inactive atmosphere such as nitrogen atmosphere during when temperature is maintained after the temperature rise. The temperature to be maintained here is preferably 1400 to 1600° C.

Next, the edge of the β-Ga$_2$O$_3$-based single-crystal substrate 1 is chamfered (bevel process) at a desired angle.

Next, the β-Ga$_2$O$_3$-based single-crystal substrate 1 is ground to a desired thickness by a diamond abrasive grinding wheel. The grit number of the grinding wheel is preferably about #800 to #1000 (defined by JIS B 4131).

Next, the β-Ga$_2$O$_3$-based single-crystal substrate is polished to a desired thickness using a turntable and diamond slurry. It is preferable to use a turntable formed of a metal-based or glass-based material. A grain size of the diamond slurry is preferably about 0.5 μm.

Next, the β-Ga$_2$O$_3$-based single-crystal substrate 1 is polished using a polishing cloth and CMP (Chemical Mechanical Polishing) slurry until atomic-scale flatness is obtained. The polishing cloth formed of nylon, silk fiber or urethane, etc., is preferable. Slurry of colloidal silica is preferably used. The principal surface of the β-Ga$_2$O$_3$-based single-crystal substrate 1 after the CMP process has a mean roughness Ra of about 0.05 to 0.1 nm.

(Quality Evaluation Method for β-Ga$_2$O$_3$-Based Single-Crystal Substrate)

The β-Ga$_2$O$_3$-based single-crystal substrate 1 obtained by the above-mentioned method, etc., is subjected to X-ray rocking curve measurement to evaluate crystal quality. The crystal quality is evaluated by evaluating variation in crystal structure of the substrate along the direction parallel to the principal surface as well as perpendicular to the b-axis.

Figure 4:
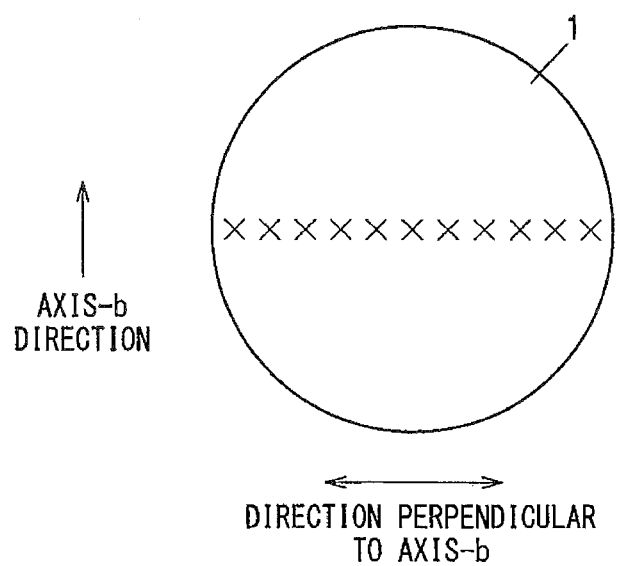
FIG. 4 is plan view showing a β-Ga$_2$O$_3$-based single-crystal substrate cut out from the β-Ga$_2$O$_3$-based single crystal and X-ray diffraction measurement positions thereon.

FIG. 4 is a plan view showing the β-Ga$_2$O$_3$-based single-crystal substrate 1 cut out from the β-Ga$_2$O$_3$-based single crystal and X-ray diffraction measurement positions thereon. X-ray diffraction intensity is measured at measurement points shown as "x" in FIG. 4 while rotating the substrate about the b-axis of the β-Ga$_2$O$_3$-based single crystal, thereby obtaining X-ray rocking curve. These measurement points are aligned on a straight line on the principal surface, which is a line passing through the center of the principal surface of the β-Ga$_2$O$_3$-based single-crystal substrate 1 and perpendicular to the b-axis.

Figure 5:
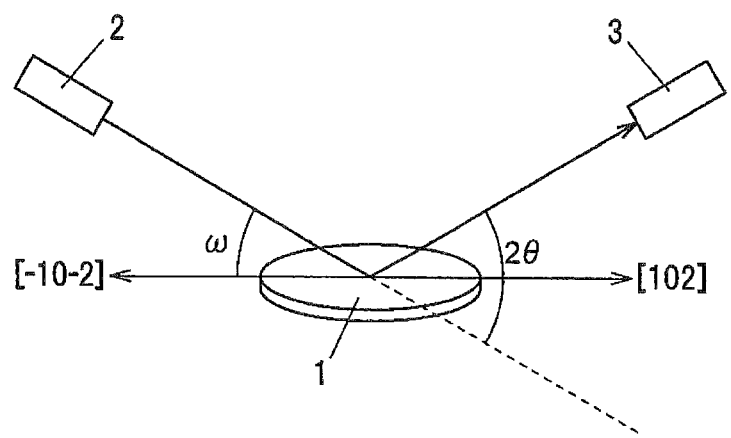
FIG. 5 is a schematic diagram illustrating a state during X-ray rocking curve measurement.

FIG. 5 is a schematic diagram illustrating a state during X-ray rocking curve measurement. A component of an X-ray emitted from an X-ray generator 2, when a direction of incidence on the β-Ga$_2$O$_3$-based single-crystal substrate 1 (a direction from the X-ray generator 2 toward the measurement position on the principal surface of the β-Ga$_2$O$_3$-based single-crystal substrate 1) comes parallel to the principal surface of the β-Ga$_2$O$_3$-based single-crystal substrate 1, coincides with a straight line on which the measurement points are lined up. FIG. 5 shows, as an example, an incident direction of X-ray when measuring on a straight line which is parallel to a [102] direction and passes through the center of the (−201)-oriented principal surface of the β-Ga$_2$O$_3$-based single-crystal substrate 1.

In FIG. 5, ω is an angle [deg] formed by the incident direction of the X-ray and the principal surface of the β-Ga$_2$O$_3$-based single-crystal substrate 2, and 2θ is an angle formed by the incident direction of the X-ray and a direction from the measurement point toward an X-ray detector 3. To obtain a diffraction peak in X-ray rocking curve measurement, ω is changed around an angle satisfying the Bragg's condition in a state that 2θ is fixed.

This X-ray diffraction measurement was conducted on a non-doped β-Ga$_2$O$_3$-based single-crystal substrate (referred to as "substrate A"), two β-Ga$_2$O$_3$-based single-crystal substrates doped with Sn as a dopant at a charge ratio of 0.030 mol % (referred to as "substrates B and C") and three β-Ga$_2$O$_3$-based single-crystal substrates doped with Si as a dopant at a charge ratio of 0.020 mol % (referred to as "substrates D, E and F").

The substrates A, B, C, D and E are substrates cut out from the β-Ga$_2$O$_3$-based single crystals 32 grown in the b-axis direction by using the EFG crystal manufacturing apparatus 10 described above, and the substrate F is a substrate cut out from the β-Ga$_2$O$_3$-based single crystal 32 grown by using an apparatus which is basically the same as the EFG crystal manufacturing apparatus 10 but is not equipped with the after-heater 20 and the reflective plate 21. The principal surfaces of the substrates A, B, C, D and E are the (−201) plane parallel to the b-axis.

FIGS. 6A to 6C and 7A to 7C are graphs showing the curved lines and approximation lines thereof which represent a relation between the measurement position on the substrate and an angle ω$_r$ [deg]. In FIGS. 6A to 6C and 7A to 7C, the horizontal axis indicates a position [mm] on the substrate in the direction perpendicular to the b-axis, and the vertical axis indicates the angle $\omega_r$ [deg].

Here, $\omega_s$ is a value of $\omega$ at a peak position of an X-ray rocking curve and $\omega_r$ is a value obtained by subtracting an average of $\omega_s$ measured on a straight line from $\omega_s$. $\omega_r$ is indicated on the vertical axis in FIGS. 6 and 7 since each graph is standardized such that the average value of $\omega_s$ in becomes 0°, and it is thus easy to compare the graphs.

Figure 6A:
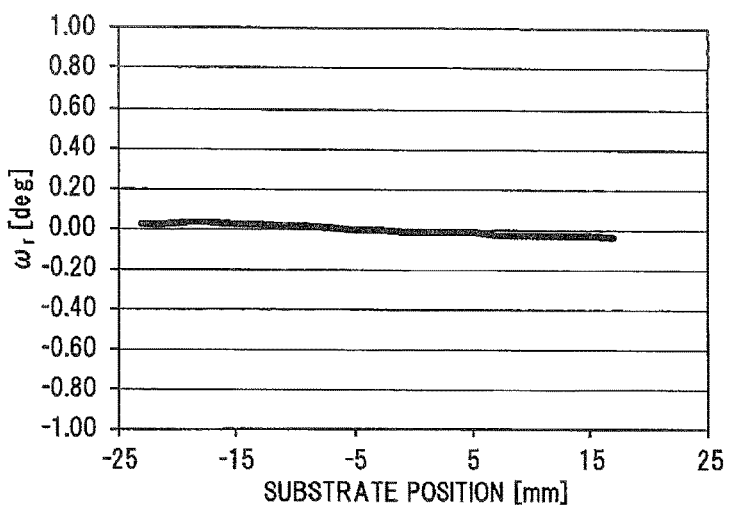
FIG. 6A is a graph showing a curved line representing a relation between a measurement position on the substrate and $\omega_r$ as a value of $\omega$ at an X-ray rocking curve peak position and also showing an approximation line thereof obtained by linear approximation using the least squares method.
Figure 6B:
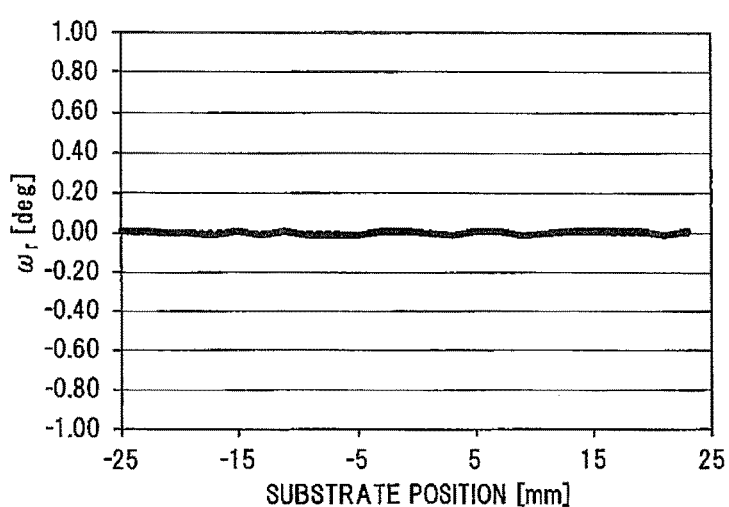
FIG. 6B is a graph showing a curved line representing a relation between a measurement position on the substrate and $\omega_r$ as a value of $\omega$ at an X-ray rocking curve peak position and also showing an approximation line thereof obtained by linear approximation using the least squares method.
Figure 6C:
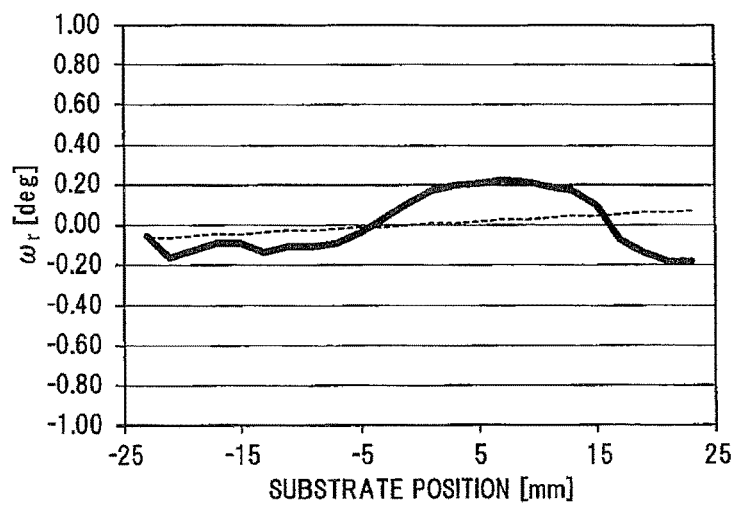
FIG. 6C is a graph showing a curved line representing a relation between a measurement position on the substrate and $\omega_r$ as a value of $\omega$ at an X-ray rocking curve peak position and also showing an approximation line thereof obtained by linear approximation using the least squares method.
Figure 7A:
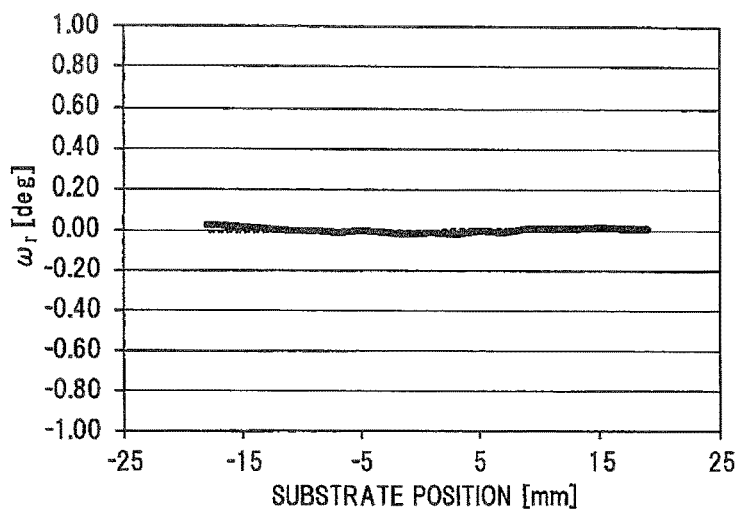
FIG. 7A is a graph showing a curved line representing a relation between a measurement position on the substrate and $\omega_r$ as a value of $\omega$ at an X-ray rocking curve peak position and also showing an approximation line thereof obtained by linear approximation using the least squares method.
Figure 7B:
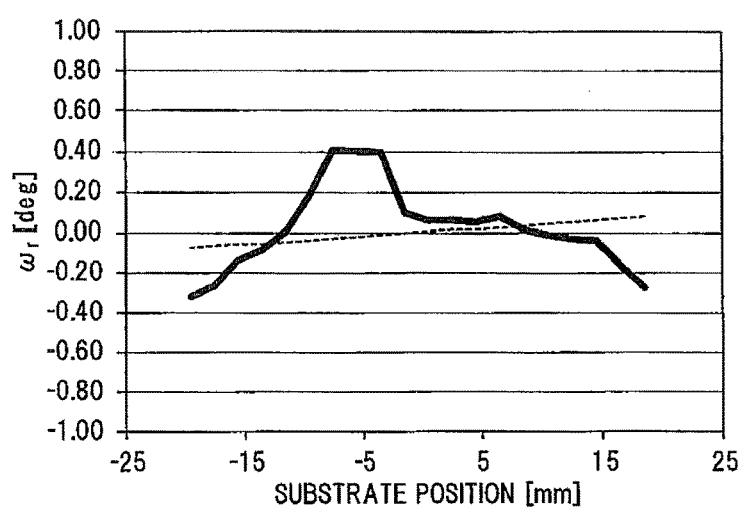
FIG. 7B is a graph showing a curved line representing a relation between a measurement position on the substrate and $\omega_r$ as a value of $\omega$ at an X-ray rocking curve peak position and also showing an approximation line thereof obtained by linear approximation using the least squares method.
Figure 7C:
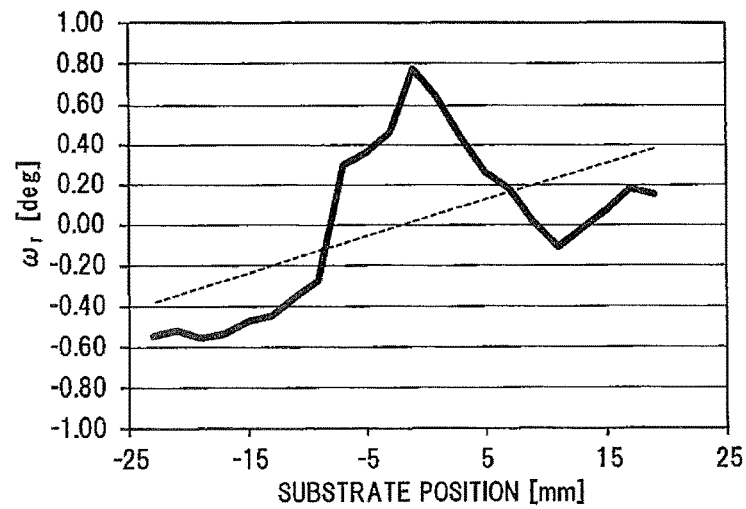
FIG. 7C is a graph showing a curved line representing a relation between a measurement position on the substrate and $\omega_r$ as a value of $\omega$ at an X-ray rocking curve peak position and also showing an approximation line thereof obtained by linear approximation using the least squares method.

FIGS. 6A, 6B and 6C are graphs respectively showing the measurement results of the substrates A, B and C. FIGS. 7A, 7B and 7C are graphs respectively showing the measurement results of the substrates D, E and F. The diffraction peaks of X-ray rocking curve in FIGS. 6A to 6C and 7A to 7C are from a (−402) plane.

Based on FIGS. 6A to 6C and 7A to 7C, an angle on a straight approximation line (hereinafter, referred to as $\omega_a$) is subtracted from the angle $\omega_r$ at each measurement position, and a difference $\Delta\omega$ [deg] between the maximum value and the minimum value of the obtained value is calculated. Also, the angle $\omega_a$ is subtracted from the angle $\omega_r$ at each measurement position, and the average $\alpha$ [deg] of absolute values of the obtained values is calculated. To obtain the approximation line, the curved line representing a relation between the measurement position and the angle $\omega_r$ is linearly approximated using the least squares method.

$\Delta\omega$ also can be obtained by using $\omega_s$ instead of using $\omega_r$. In other words, the approximation line of the curved line representing a relation between $\omega_s$ and the measurement position is obtained by linear approximation using the least squares method, the angle $\omega_a$ on the approximation line is subtracted from $\omega_s$ at each measurement position, and $\Delta\omega$ is obtained as a difference between the maximum value and the minimum value of the value obtained by the subtraction. Obviously, the value of $\Delta\omega$ is the same either with $\omega_r$ or with $\omega_s$. Likewise, $\alpha$ can be obtained by using $\omega_s$ instead of $\omega_r$.

The smaller the variation in the angle $\omega_r$ in a direction perpendicular to the b-axis, the smaller the values of $\Delta\omega$ and $\alpha$, and thus the smaller the variation in crystal structure of the substrate along the direction perpendicular to the b-axis.

Plural β-Ga$_2$O$_3$-based single-crystal substrates doped with Sn as a dopant were cut out from the β-Ga$_2$O$_3$-based single crystal 32 grown by the EFG crystal manufacturing apparatus 10, and x-ray diffraction was also conducted on substrates other than the substrates B and C. The substrate C had the largest $\Delta\omega$ and $\alpha$ among all substrates including the substrates B and C.

Meanwhile, plural β-Ga$_2$O$_3$ single-crystal substrates doped with Si as a dopant were cut out from the β-Ga$_2$O$_3$-based single crystal 32 grown by the EFG crystal manufacturing apparatus 10, and x-ray diffraction was also conducted on substrates other than the substrates D and E. The substrate E had the largest $\Delta\omega$ and $\alpha$ among all substrates including the substrates D and E.

The numerical values of the $\Delta\omega$ and $\alpha$ of each substrate are shown in Table 1 below.

TABLE 1

| Substrate | Dopant | After-heater and Reflective plate | $\Delta\omega$ [deg] | $\alpha$ [deg] |
|---|---|---|---|---|
| A | — | With | 0.0215 | 0.005 |
| B | Sn | With | 0.0212 | 0.007 |
| C | Sn | With | 0.4540 | 0.119 |
| D | Si | With | 0.0473 | 0.011 |
| E | Si | With | 0.7264 | 0.141 |
| F | Si | Without | 1.1569 | 0.283 |

Although the principal surface of the substrates A, B, C, D, E and F are the (−201) plane as described above, similar $\Delta\omega$ and $\alpha$ are obtained from other planes such as (101) or (001) plane as long as it is parallel to the b-axis.

Group IV elements such as Sn, Si, Ge and Pb are elements suitable as an n-type dopant for β-Ga$_2$O$_3$-based single crystals. When Ge or Pb, which are Group IV elements and not shown in Table 1, is used as a dopant, variation in crystal structure ($\Delta\omega$ and $\alpha$) of the β-Ga$_2$O$_3$-based single-crystal substrate is substantially the same as when using Si.

The values of $\Delta\omega$ and $\alpha$ of the substrates A, B, C, D and E are respectively not more than 0.7264 and not more than 0.141, and are smaller than those of the substrate F. This is because the substrates A, B, C, D and E are cut out from the β-Ga$_2$O$_3$-based single crystal 32 grown by the EFG crystal manufacturing apparatus 10 which is equipped with the after-heater 20 and the reflective plate 21.

The substrates A, B, C, D and E are substrates cut out from the β-Ga$_2$O$_3$-based single crystal 32 grown in the b-axis direction. Therefore, the values of $\Delta\omega$ and $\alpha$ on a straight line located on the principal surface and perpendicular to the b-axis coincident with the growth direction of the β-Ga$_2$O$_3$-based single crystal 32 are the largest among $\Delta\omega$ and $\alpha$ on any straight lines (all straight lines) on the principal surfaces of the substrates A, B, C, D and E. In other words, when $\Delta\omega$ and $\alpha$ on, e.g., a straight line perpendicular to the b-axis are respectively not more than 0.7264 and not more than 0.141, the maximum values of $\Delta\omega$ and $\alpha$ on a given straight line are respectively not more than 0.7264 and not more than 0.141.

Change in $\Delta\omega$ and $\alpha$ caused by warpage of substrate was evaluated. The result is as follows. $\Delta\omega$ and $\alpha$ are parameters obtained from inclination of crystal lattice of each portion on the substrate surface, and are thus affected also by warpage of substrate in addition to variation in crystal structure of the substrate. This evaluation is conducted to demonstrate that change in $\Delta\omega$ and $\alpha$ caused by warpage of substrate is well smaller than change in $\Delta\omega$ and $\alpha$ caused by variation in crystal structure and does not affect the evaluation of variation in crystal structure using the values of $\Delta\omega$ and $\alpha$.

Firstly, five substrates having a (−201)-oriented principal surfaces and doped with Sn as a dopant at a charge ratio of 0.10 mol % (referred to as "substrates G, H, I, J and K") are cut out from the β-Ga$_2$O$_3$-based single crystal 32 grown by using the EFG crystal manufacturing apparatus 10, and height of the surface is measured at each position on the substrate surface. Values of "Bow" and "Warp", which are indications of level of warpage of substrate, are obtained from data of the height of surface at each position.

Next, based on the data of the height of surface at each position on the substrate surface, an inclination θ at each position on the substrate surface is calculated. The inclination θ causes the angle ω in X-ray rocking curve to be shifted (by θ°). $\Delta\omega$ and $\alpha$ affected by warpage of substrate can be obtained based on the inclination θ at each position on the substrate surface.

Table 2 below shows the numerical values of Bow and Warp indicating the level of warpage of the substrates G, H, I, J and K, and also shows the numerical values, affected by warpage of each substrate, of $\Delta\omega$ and $\alpha$ on a straight line which is located on the principal surface, passes through the center of the principal surface of the substrate and is perpendicular to the b-axis.

TABLE 2

| Substrate | Δω [deg] | α [deg] | Bow [μm] | Warp [μm] |
|---|---|---|---|---|
| G | 0.0540 | 0.002 | −9.479 | 15.704 |
| H | 0.0551 | 0.002 | −12.933 | 24.805 |
| I | 0.0471 | 0.003 | −11.239 | 22.462 |
| J | 0.0469 | 0.003 | −10.905 | 18.758 |
| K | 0.0595 | 0.003 | −10.838 | 14.451 |

As shown in Table 2, the numerical values of Δω and α affected by warpage of substrate are well smaller than the change in Δω and α caused by variation in crystal structure shown in Table 1, and substantially do not have an impact on the evaluation of variation in crystal structure using the values of Δω and α. Such warpage level of substrate which is cut out from the β-Ga$_2$O$_3$-based single crystal 32 substantially does not depend on the presence of dopant or the type of dopant.

Effects of the Embodiment

According to the present embodiment, it is possible to obtain a high-quality β-Ga$_2$O$_3$-based single-crystal substrate having little small variation in crystal structure even when a dopant is added.

Although the embodiment of the invention has been described, the invention is not intended to be limited to the embodiment, and the various kinds of modifications can be implemented without departing from the gist of the invention.

In addition, the invention according to claims is not to be limited to the embodiment described above. Further, it should be noted that all combinations of the features described in the embodiment are not necessary to solve the problem of the invention.

INDUSTRIAL APPLICABILITY

A high-quality β-Ga$_2$O$_3$-based single-crystal substrate having little variation in crystal structure is provided.

REFERENCE SIGNS LIST

1: β-Ga$_2$O$_3$-based single crystal substrate
32: β-Ga$_2$O$_3$-based single crystal
113: lid

The invention claimed is:

1. A β-Ga$_2$O$_3$-based single-crystal substrate, comprising:
a β-Ga$_2$O$_3$-based single crystal; and
a principal surface being a plane parallel to a b-axis of the β-Ga$_2$O$_3$-based single crystal, wherein the maximum value of Δω on an arbitrary straight line on the principal surface that passes through the center of the principal surface is not more than 0.7264, and
wherein the Δω is the difference between the maximum value and the minimum value of values obtained by subtracting ωa from ωs at each of measurement positions, where ωs represents an angle defined by an X-ray incident direction and the principal surface at a peak position of an X-ray rocking curve on the straight line and ωa represents an angle on an approximated straight line obtained by using least-squares method to linearly approximate a curve representing a relationship between the ωs and the measurement positions thereof, wherein the β-Ga$_2$O$_3$-based single-crystal substrate comprises a dopant, wherein the dopant is a Group IV element.

2. A β-Ga$_2$O$_3$-based single-crystal substrate, comprising:
a β-Ga$_2$O$_3$-based single crystal; and
a principal surface being a plane parallel to a b-axis of the β-Ga$_2$O$_3$-based single crystal, wherein the maximum value of α on an arbitrary straight line on the principal surface that passes through the center of the principal surface is not more than 0.141, and
wherein the α is an average value of absolute values obtained by subtracting ωa from ωs at each of measurement positions, where ωs represents an angle defined by an X-ray incident direction and the principal surface at a peak position of an X-ray rocking curve on the straight line and ωa represents an angle on an approximated straight line obtained by using least-squares method to linearly approximate a curve representing a relationship between the ωs and the measurement positions thereof, wherein the β-Ga$_2$O$_3$-based single-crystal substrate comprises a dopant, wherein the dopant is a Group IV element.

3. The β-Ga$_2$O$_3$-based single-crystal substrate according to claim 1, wherein Δω on a straight line perpendicular to the b-axis of the β-Ga$_2$O$_3$-based single crystal is a maximum among the Δω on the arbitrary straight line.

4. The β-Ga$_2$O$_3$-based single-crystal substrate according to claim 2, wherein α on a straight line perpendicular to the b-axis of the β-Ga$_2$O$_3$-based single crystal is a maximum among the α on the arbitrary straight line.

5. The β-Ga$_2$O$_3$-based single-crystal substrate according to claim 1, wherein the dopant is Sn or Si.

6. The β-Ga$_2$O$_3$-based single-crystal substrate according to claim 1, wherein the principal surface is a (−201) plane, a (101) plane or a (001) plane.

7. The β-Ga$_2$O$_3$-based single-crystal substrate according to claim 1, wherein the substrate is cut out from a flat-plate-shaped β-Ga$_2$O$_3$-based single crystal grown in the b-axis direction.

8. The β-Ga$_2$O$_3$-based single-crystal substrate according to claim 1, wherein the substrate comprises no twinning plane or a region that does not include a twinning plane that is not less than 2 inches in a maximum width in a direction perpendicular to an intersection line between the twinning plane and the principal surface.

* * * * *